US012599028B2

(12) United States Patent
Oh

(10) Patent No.: US 12,599,028 B2
(45) Date of Patent: Apr. 7, 2026

(54) SEMICONDUCTOR PACKAGES HAVING ADHESIVE MEMBERS

(71) Applicant: Samsung Electronics Co., Ltd., Suwon-si (KR)

(72) Inventor: Jooyoung Oh, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 668 days.

(21) Appl. No.: 17/720,064

(22) Filed: Apr. 13, 2022

(65) Prior Publication Data

US 2023/0098993 A1 Mar. 30, 2023

(30) Foreign Application Priority Data

Sep. 17, 2021 (KR) ........................ 10-2021-0124718

(51) Int. Cl.
*H01L 23/00* (2006.01)
*H01L 23/31* (2006.01)
*H01L 25/065* (2023.01)

(52) U.S. Cl.
CPC .......... *H01L 24/32* (2013.01); *H01L 23/3128* (2013.01); *H01L 24/33* (2013.01); *H01L 24/48* (2013.01); *H01L 24/73* (2013.01); *H01L 25/0657* (2013.01); *H01L 2224/3201* (2013.01); *H01L 2224/32054* (2013.01); *H01L 2224/32058* (2013.01); *H01L 2224/32059* (2013.01); *H01L 2224/32145* (2013.01); *H01L 2224/32225* (2013.01); *H01L 2224/3303* (2013.01); *H01L 2224/33055* (2013.01); *H01L 2224/48149* (2013.01); *H01L 2224/48228* (2013.01); *H01L 2224/73265* (2013.01); *H01L*

*2225/06506* (2013.01); *H01L 2225/0651* (2013.01); *H01L 2225/06524* (2013.01);
(Continued)

(58) Field of Classification Search
CPC ..... H01L 24/32; H01L 23/3128; H01L 24/33; H01L 24/48; H01L 24/73; H01L 25/0657
USPC ........................................... 257/686
See application file for complete search history.

(56) References Cited

U.S. PATENT DOCUMENTS

| | | | |
|---|---|---|---|
| 7,352,057 B2 * | 4/2008 | Grafe ..................... | H01L 24/48 |
| | | | 438/109 |
| 7,781,878 B2 * | 8/2010 | Chen ..................... | H01L 23/525 |
| | | | 257/676 |
| 7,928,551 B2 | 4/2011 | Fujiwara et al. | |

(Continued)

FOREIGN PATENT DOCUMENTS

KR 1020180080071 A 7/2018

*Primary Examiner* — Ori Nadav
(74) *Attorney, Agent, or Firm* — Muir Patent Law, PLLC

(57) ABSTRACT

A semiconductor package includes a package substrate, a first semiconductor chip and a second semiconductor chip sequentially stacked on the package substrate, the first semiconductor chip and the second semiconductor chip being disposed in a form of an offset stack structure, and the second semiconductor chip including an overhang further protruding beyond a side surface of the first semiconductor chip in a first horizontal direction, an adhesive member disposed on a lower surface of the second semiconductor chip, the adhesive member including an extension extending to a lower level than an upper surface of the first semiconductor chip. The extension contacts the side surface of the first semiconductor chip, and overlaps with at least a portion of the overhang in a vertical direction.

20 Claims, 12 Drawing Sheets

(52) U.S. Cl.
CPC ............... *H01L 2225/06562* (2013.01); *H01L 2924/15311* (2013.01); *H01L 2924/3512* (2013.01)

(56) References Cited

U.S. PATENT DOCUMENTS

| | | | | |
|---|---|---|---|---|
| 8,026,586 B2 * | 9/2011 | Kim | .................. | H01L 23/49816 |
| | | | | 257/777 |
| 8,084,850 B2 * | 12/2011 | Shin | .................... | H01L 25/0657 |
| | | | | 257/E23.141 |
| 8,729,688 B2 * | 5/2014 | Jung | .................. | H01L 23/3128 |
| | | | | 257/777 |
| 9,129,846 B2 | 9/2015 | Song et al. | | |
| 10,096,552 B2 | 10/2018 | Kim et al. | | |
| 10,756,062 B2 | 8/2020 | Kim et al. | | |
| 2007/0045864 A1 * | 3/2007 | Shiba | ....................... | H01L 24/83 |
| | | | | 257/777 |
| 2013/0037952 A1 * | 2/2013 | Jung | .................. | H01L 25/0657 |
| | | | | 257/738 |
| 2016/0225959 A1 * | 8/2016 | Pan | ......................... | H01L 33/54 |
| 2017/0323844 A1 * | 11/2017 | Karlicek, Jr. | ....... | H01L 23/4951 |
| 2020/0227387 A1 | 7/2020 | Ku et al. | | |

* cited by examiner

100a

100a

<u>100e</u>

<u>100f</u>

100i

100j

SEMICONDUCTOR PACKAGES HAVING ADHESIVE MEMBERS

CROSS-REFERENCE TO THE RELATED APPLICATION

This application claims priority under 35 U.S.C. § 119 from Korean Patent Application No. 10-2021-0124718, filed on Sep. 17, 2021, in the Korean Intellectual Property Office, the disclosure of which is incorporated herein by reference in its entirety.

BACKGROUND

1. Field

The exemplary embodiments of the disclosure relate to a semiconductor package having an adhesive member.

2. Description of the Related Art

In accordance with a tendency of a semiconductor device toward miniaturization, research on a multi-chip semiconductor package is being conducted. The multi-chip semiconductor package includes a structure in which a plurality of semiconductor chips is stacked.

SUMMARY

The exemplary embodiments of the disclosure provide a semiconductor package having an adhesive member.

A semiconductor package according to exemplary embodiments of the disclosure may include a package substrate including upper pads, a first semiconductor chip and a second semiconductor chip sequentially stacked on the package substrate, the first semiconductor chip and the second semiconductor chip being disposed in a form of an offset stack structure, and the second semiconductor chip including an overhang further protruding beyond a side surface of the first semiconductor chip in a first horizontal direction, bonding wires connecting the first semiconductor chip and the second semiconductor chip to the upper pads, an adhesive member disposed on a lower surface of the second semiconductor chip, the adhesive member including an extension extending to a lower level than an upper surface of the first semiconductor chip, and an encapsulant covering the package substrate, the first semiconductor chip and the second semiconductor chip. The extension may contact the side surface of the first semiconductor chip, and may overlap with at least a portion of the overhang in a vertical direction.

A semiconductor package according to exemplary embodiments of the disclosure may include a package substrate including upper pads, first to fourth semiconductor chips sequentially stacked on the package substrate, the first to fourth semiconductor chips being disposed in a form of an offset stack structure, and each of the second to fourth semiconductor chips including an overhang further protruding in a first horizontal direction beyond a side surface of the semiconductor chip disposed immediately thereunder, bonding wires connecting the first to fourth semiconductor chips to the upper pads, adhesive members respectively disposed on lower surfaces of the second to fourth semiconductor chips, the adhesive members including extensions, respectively, and an encapsulant covering the package substrate and the first to fourth semiconductor chips. A lowermost one of the extensions may contact the side surface of the first semiconductor chip, and may overlap with at least a portion of the overhang of the second semiconductor chip in a vertical direction.

A semiconductor package according to exemplary embodiments of the disclosure may include a package substrate including upper pads and outer connection terminals, the upper pads being disposed on an upper surface of the package substrate, and the outer connection terminals being disposed on a lower surface of the package substrate, a first semiconductor chip and a second semiconductor chip sequentially stacked on the package substrate, the first semiconductor chip and the second semiconductor chip being disposed in a form of an offset stack structure, and the second semiconductor chip including an overhang further protruding beyond a side surface of the first semiconductor chip in a first horizontal direction, bonding wires connecting the first semiconductor chip and the second semiconductor chip to the upper pads, an adhesive member disposed on a lower surface of the second semiconductor chip, the adhesive member including an extension extending to a lower level than an upper surface of the first semiconductor chip, and an encapsulant covering the package substrate, the first semiconductor chip, and the second semiconductor chip. The first semiconductor chip may include a device layer, a lower insulating layer, an upper insulating layer, and a protective layer sequentially stacked on a first semiconductor substrate. The extension may contact the device layer, the lower insulating layer, the upper insulating layer, and the protective layer, and may overlap with at least a portion of the overhang in a vertical direction.

DETAILED DESCRIPTION OF EXEMPLARY EMBODIMENTS

Example embodiments will be more clearly understood from the following brief description taken in conjunction with the accompanying drawings. Like numerals refer to like elements throughout. The accompanying drawings represent non-limiting, example embodiments as described herein.

Figure 1:
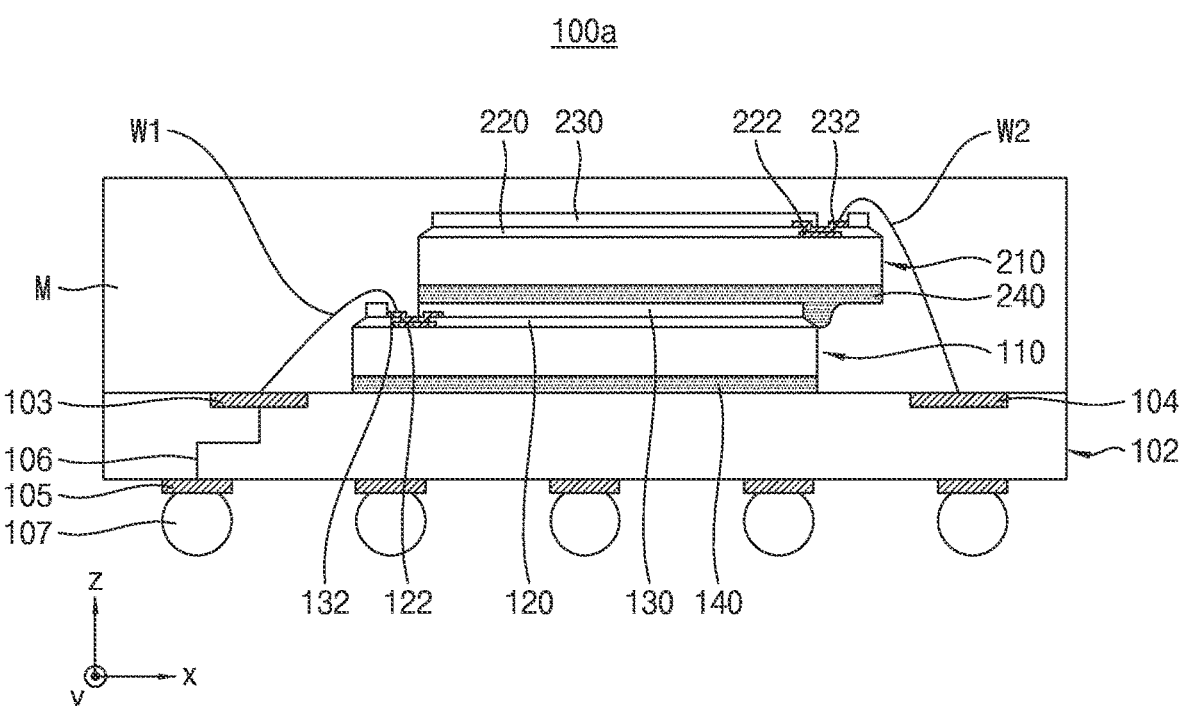
FIG. 1 is a vertical cross-sectional view of a semiconductor package, according to an exemplary embodiment of the disclosure.

FIG. 1 is a vertical cross-sectional view of a semiconductor package according to an exemplary embodiment of the disclosure.

Referring to FIG. 1, a semiconductor package 100a may include a package substrate 102, a first semiconductor chip 110, an adhesive member 140, a second semiconductor chip 210, an adhesive member 240, and an encapsulant M.

The package substrate 102 may include upper pads 103 and 104, lower pads 105, a wiring 106, and outer connection terminals 107. In an embodiment, the package substrate 102 may be a printed circuit board, and may include an insulating material such as a phenolic resin, an epoxy resin, a prepreg, or the like. In another embodiment, the package substrate 102 may be a redistribution layer in which an insulating material and a conductive material are stacked. The upper pads 103 and 104 and the lower pads 105 may be formed by forming a metal layer on a base of the package substrate 102, and then patterning the metal layer. Although not shown, a solder resist layer may be disposed on an upper surface and a lower surface of the package substrate 102, and may partially cover the upper pads 103 and 104 and the lower pads 105.

The semiconductor package 100a may further include a first bonding wire W1 and a second bonding wire W2 which connect the upper pads 103 and 104 to the first semiconductor chip 110 and the second semiconductor chip 210, respectively. The upper pads 103 and 104 may be disposed on the upper surface of the package substrate 102, and may be electrically connected to the first semiconductor chip 110 and the second semiconductor chip 210, respectively. The lower pads 105 may be disposed on the lower surface of the package substrate 102, and the upper pads 103 and 104 may be electrically connected to corresponding ones of the lower pads 105 by the wiring 106. Outer connection terminals 107 may be disposed under the lower pads 105.

The upper pads 103 and 104 and the lower pads 105 may include a metal such as aluminum (Al), titanium (Ti), chromium (Cr), iron (Fe), cobalt (Co), nickel (Ni), copper (Cu), zinc (Zn), lead (Pd), platinum (Pt), gold (Au), and silver (Ag). The wiring 106 may include copper (Cu), aluminum (Al), tungsten (W), nickel (Ni), titanium (Ti), titanium nitride (TiN), tantalum (Ta), tantalum nitride (TaN), gold (Au), or a combination thereof. The outer connection terminal 107 may be a solder bump.

The first semiconductor chip 110 and the second semiconductor chip 210 may be sequentially mounted on the package substrate 102. Although two semiconductor chips are shown in FIG. 1 as being stacked, the exemplary embodiments of the disclosure are not limited thereto. The first semiconductor chip 110 and the second semiconductor chip 210 may include a volatile memory chip such as DRAM or a non-volatile memory chip such as RRAM and flash memory.

The first semiconductor chip 110 and the second semiconductor chip 210 may be mounted on the package substrate 102 via wire bonding, and may be connected to the first bonding wire W1 and the second bonding wire W2, respectively, as described above. In an embodiment, the first semiconductor chip 110 and the second semiconductor chip 210 may not be aligned in a vertical direction (a z direction), and may be disposed in the form of an offset stack structure. For example, the first semiconductor chip 110 and the second semiconductor chip 210 may be stacked to be spaced apart from each other by a predetermined distance in an x direction. For example, a side surface of the first semiconductor chip 110 may be offset from a side surface of the second semiconductor chip 210 by a predetermined distance in the x direction. A portion of an upper surface of the first semiconductor chip 110 may be exposed without being covered by the second semiconductor chip 210. For example, a first portion of the first semiconductor chip 110 may be overlapped by the second semiconductor chip 210 in the z direction, and a second portion of the first semiconductor chip 110 may not be overlapped by the second semiconductor chip 210 in the z direction. As used herein, the horizontal direction may refer to the x direction and/or the y direction, and the vertical direction may refer to the z direction. The horizontal direction may be a direction parallel to a top surface of the package substrate 102, and the vertical direction may be a direction perpendicular to the top surface of the package substrate 102.

The first semiconductor chip 110 may include an upper insulating layer 120, a chip pad 122, a protective layer 130, and a connection pad 132. The upper insulating layer 120 may be disposed on an upper portion of the first semiconductor chip 110. The protective layer 130 may be disposed on the upper insulating layer 120, and may protect the upper insulating layer 120 from external physical impact. The chip pad 122 may be buried in the upper insulating layer 120. As used herein, the term "buried" may refer to structures, patterns, and/or layers that are formed at least partially below a top surface of another structure, pattern, and/or layer. In some embodiments, when a first structure, pattern, and/or layer is "buried" in a second structure, pattern, and/or layer, the second structure, pattern, and/or layer may surround at least a portion of the first structure, pattern, and/or layer. For example, a first structure, pattern, and/or layer first may be considered to be buried when it is at least partially embedded in a second structure, pattern, and/or layer.

The chip pad 122 may include, for example, a ground pad, a power pad, an AC pad, a data pad, and a DC pad. The ground pad may be a pad for providing a reference potential for circuit operation of the semiconductor chip. The power pad may be a pad for supplying power for circuit operation. The AC pad may be a pad for supplying AC power to the semiconductor chip or receiving a signal for execution of an AC test. The data pad may be a pad for input/output of a logic signal or data. The DC pad may be a pad for measuring a potential level of a particular position of the semiconductor chip.

The connection pad 132 may be disposed on the chip pad 122, and may be buried in the protective layer 130. The connection pad 132 may contact an upper surface of the chip pad 122. A portion of the connection pad 132 may not be covered by the protective layer 130, and may be directly connected to the first bonding wire W1. The chip pad 122 may be electrically connected to the upper pad 103 disposed on the upper surface of the package substrate 102 by the connection pad 132 and the first bonding wire W1. The chip pad 122 and the connection pad 132 may include a metal such as aluminum (Al), titanium (Ti), chromium (Cr), iron (Fe), cobalt (Co), nickel (Ni), copper (Cu), zinc (Zn), lead (Pd), platinum (Pt), gold (Au), and silver (Ag). As used herein, the term "contact" refers to a direct connection (i.e., touching) unless the context indicates otherwise.

The adhesive member 140 may be disposed between the package substrate 102 and the first semiconductor chip 110. In some embodiments, the adhesive member 140 may contact an upper surface of the package substrate 102 and a lower surface of the first semiconductor chip 110. The adhesive member 140 may fix the first semiconductor chip 110 to the upper surface of the package substrate 102. The adhesive member 140 may be a die attach film (DAF), without being limited thereto.

The second semiconductor chip 210 may be disposed on the first semiconductor chip 110. The second semiconductor chip 210 may include a configuration identical or similar to a configuration of the first semiconductor chip 110. For example, the second semiconductor chip 210 may include an upper insulating layer 220, a chip pad 222, a protective layer 230, and a connection pad 232. The upper insulating layer 220 may be disposed on an upper portion of the second semiconductor chip 210, and the protective layer 230 may be disposed on the upper insulating layer 220, contacting an upper surface of the upper insulating layer 220. The chip pad 222 may be buried in the upper insulating layer 220. The connection pad 232 may be disposed on the chip pad 222, and may be directly connected to the second bonding wire W2. The connection pad 232 may contact a top surface of the chip pad 222. The chip pad 222 may be electrically connected to the upper pad 104 disposed on the upper surface of the package substrate 102 by the connection pad 232 and the second bonding wire W2.

The adhesive member 240 may be disposed between the first semiconductor chip 110 and the second semiconductor chip 210. For example, the adhesive member 240 may be disposed on a lower surface of the second semiconductor chip 210, and may fix the second semiconductor chip 210 to the upper surface of the first semiconductor chip 110. In some embodiments, the adhesive member 240 may contact the lower surface of the second semiconductor chip 210 and an upper surface of the protective layer 130. The adhesive member 240 may cover a least a portion of a side surface of the first semiconductor chip 110. For example, the adhesive member 240 may contact side surfaces of the upper insulating layer 120 and the protective layer 130 under a portion of the second semiconductor chip 210 protruding in the x direction beyond the first semiconductor chip 110.

The encapsulant M may cover the package substrate 102, the first semiconductor chip 110, the second semiconductor chip 210, the first bonding wire W1 and the second bonding wire W2. For example, the encapsulant M may include a bisphenol-group epoxy resin, a polycyclic aromatic epoxy resin, an o-cresol novolac epoxy resin, a biphenyl-group epoxy resin, a naphthalene-group epoxy resin, or the like.

Figure 2:
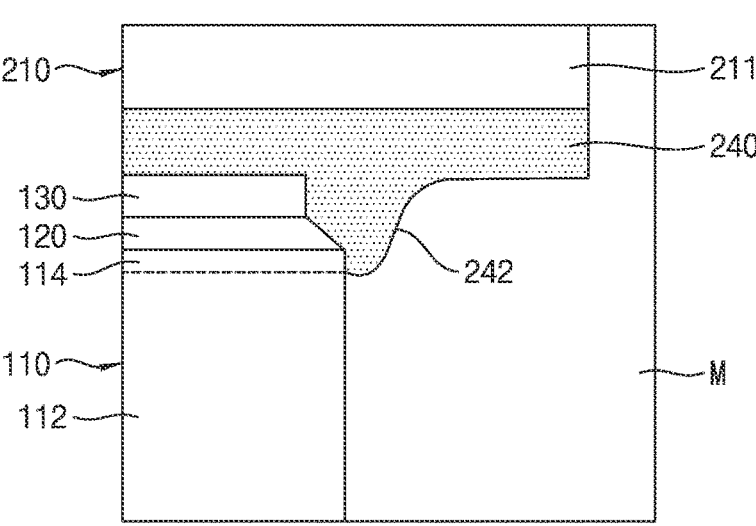
FIG. 2 is an enlarged view of a portion of FIG. 1.

FIG. 2 is an enlarged view of a portion of FIG. 1.

Referring to FIG. 2, the first semiconductor chip 110 may further include a first semiconductor substrate 112, and a device layer 114 on the first semiconductor substrate 112. The device layer 114 may be disposed between the first semiconductor substrate 112 and the upper insulating layer 120.

The adhesive member 240 may include an extension 242 extending downwards. Here, the extension 242 may be a portion of the adhesive member 240 disposed on a lower level than an upper surface of the protective layer 130. The extension 242 may be disposed under an overhang 211 (see FIG. 4) of the second semiconductor chip 210. Here, the overhang 211 of the second semiconductor chip 210 may be a portion of the second semiconductor chip 210 protruding beyond the side surface of the first semiconductor substrate 112 in the horizontal direction. That is, the overhang 211 may represent a portion of the second semiconductor chip 210 not overlapping with the first semiconductor chip 110 in the vertical direction (the z direction). The extension 242 may also be disposed between the side surface of the first semiconductor chip 110 and a side surface of the second semiconductor chip 210 in the horizontal direction. In an embodiment, the extension 242 may contact the side surface of the first semiconductor chip 110 at the upper portion of the first semiconductor chip 110. For example, the extension 242 may partially cover side surfaces of the device layer 114, the upper insulating layer 120, and the protective layer 130 of the first semiconductor chip 110. The extension 242 may be interposed between the encapsulant M and each of the device layer 114, the upper insulating layer 120 and the protective layer 130 and, as such, the device layer 114, the upper insulating layer 120 and the protective layer 130 may be prevented from contacting the encapsulant M.

Figure 3:
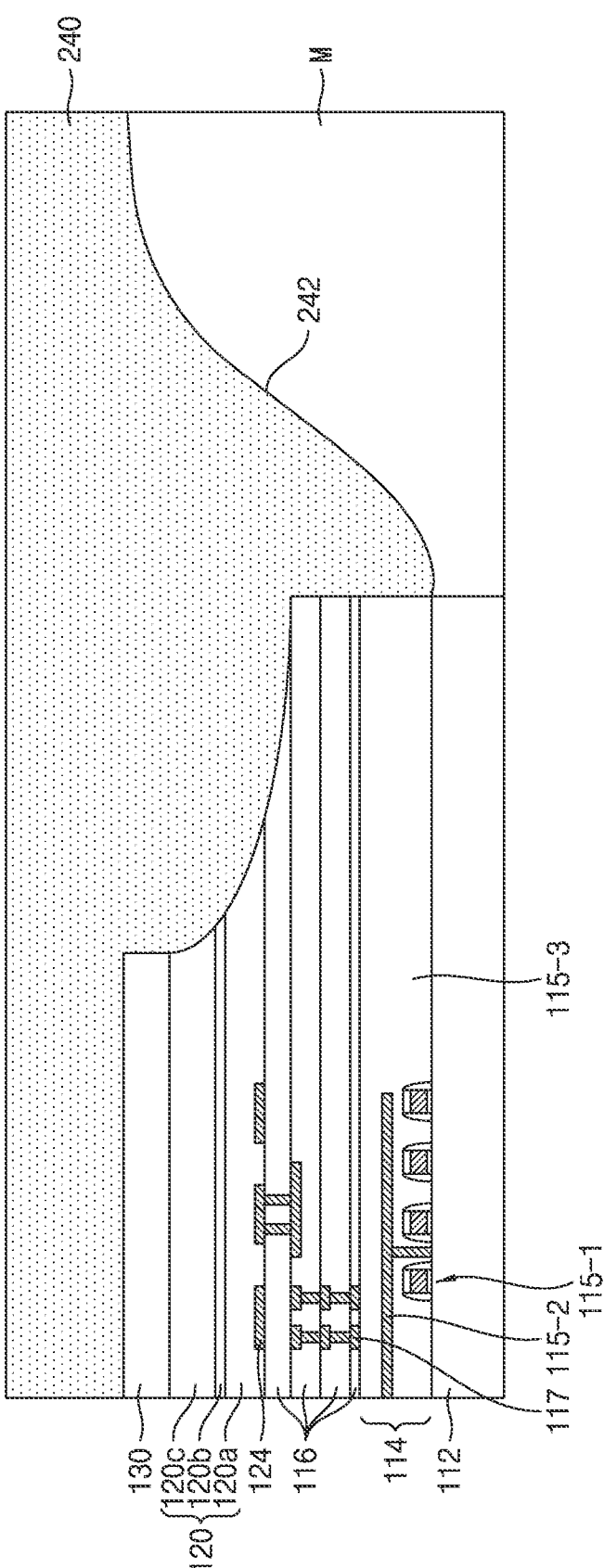
FIG. 3 is an enlarged view of a portion of FIG. 2.

FIG. 3 is an enlarged view of a portion of FIG. 2.

Referring to FIG. 3, the first semiconductor chip 110 may include the first semiconductor substrate 112, the device layer 114, the upper insulating layer 120, and the protective layer 130, as described above. In addition, the first semiconductor chip 110 may further include a lower insulating layer 116 between the device layer 114 and the upper insulating layer 120. The first semiconductor substrate 112 may include a semiconductor material. For example, the first semiconductor substrate 112 may be a silicon substrate, a germanium substrate, a silicon germanium substrate, or a silicon-on-insulator (SOI) substrate.

The device layer 114 may include a device 115-1, a lower wiring 115-2, and an interlayer insulating layer 115-3. The device 115-1 may include a memory cell array including switching elements and data storage elements, and logic devices including a MOSFET, a capacitor and a resistor. Devices 115-1 may be electrically connected to the lower wiring 115-2. The interlayer insulating layer 115-3 may cover the devices 115-1 and the lower wiring 115-2. In an embodiment, the interlayer insulating layer 115-3 may include silicon oxide, silicon nitride, silicon oxynitride, or a combination thereof.

The lower insulating layer 116 may be disposed on the interlayer insulating layer 115-3. The lower insulating layer 116 may be a plurality of lower insulating layers 116, and inner wirings 117 may be disposed among the plurality of lower insulating layers 116. At least one of the inner wirings 117 may be electrically connected to the lower wiring 115-2 of the device layer 114. In an embodiment, the lower insulating layer 116 may include silicon oxide, silicon nitride, silicon oxynitride, or a combination thereof. In an embodiment, the lower insulating layer 116 may include an insulating material such as SiCN and SiOCH.

The upper insulating layer 120 may be disposed on the lower insulating layer 116. The upper insulating layer 120 may include a first upper insulating layer 120a, a second upper insulating layer 120b, and a third upper insulating layer 120c which are sequentially stacked. The second upper insulating layer 120b may be thinner than the first upper insulating layer 120a and the third upper insulating layer 120c. In addition, the upper insulating layer 120 may include a metal pattern 124 buried in the first upper insulating layer 120a and electrically connected to the inner wiring 117. The metal pattern 124 may be disposed on the same level as the chip pad 122 shown in FIG. 1.

The side surface of the upper insulating layer 120 may be misaligned from the side surface of the first semiconductor substrate 112 and side surfaces of the device layer 114 and the lower insulating layer 116 in the vertical direction (the x direction). For example, the upper insulating layer 120 may be recessed at the side surface thereof. In cross-sectional view, the length in the x direction of the third upper insulating layer 120c may be smaller than the length in the x direction of the second upper insulating layer 120b, and the length in the x direction of the second upper insulating layer 120b may be smaller than the length in the x direction of the first upper insulating layer 120a. In an embodiment, a part of the lower insulating layers 116 may be recessed at the side surface thereof. In an embodiment, the side surfaces of the lower insulating layer 116 and the upper insulating layer 120 may be coplanar with the side surface of the first semiconductor substrate 112.

In an embodiment, the first upper insulating layer 120a, the second upper insulating layer 120b, and the third upper insulating layer 120c may include silicon oxide, silicon nitride, silicon oxynitride, or a combination thereof. The second upper insulating layer 120b may include a material having etch selectivity with respect to the first upper insulating layer 120a and the third upper insulating layer 120c. For example, the first upper insulating layer 120a may include high-density plasma (HDP) oxide, the second upper insulating layer 120b may include silicon nitride, and the third upper insulating layer 120c may include tetraethylorthosilicate (TEOS).

The protective layer 130 may be disposed on the third upper insulating layer 120c. A side surface of the protective layer 130 may be misaligned from the side surfaces of the first semiconductor substrate 112, the device layer 114 and the lower insulating layer 116 in the vertical direction (the x direction). For example, the protective layer 130 may be recessed at the side surface thereof. In an embodiment, the length in the x direction of the protective layer 130 may be equal to the length in the x direction of an upper surface of the third upper insulating layer 120c, without being limited thereto.

As described with reference to FIG. 2, the extension 242 may contact the side surface of the first semiconductor chip 110. For example, the extension 242 may contact the side surface of at least one of the device layer 114, the lower insulating layer 116, the upper insulating layer 120 and the protective layer 130. In an embodiment, the extension 242 may contact side surfaces of each of the device layer 114, the lower insulating layer 116, the upper insulating layer 120, and the protective layer 130. At least one of the device layer 114, the lower insulating layer 116, the upper insulating layer 120, and the protective layer 130 may include a low dielectric material. When the device layer 114, the lower insulating layer 116, the upper insulating layer 120, or the protective layer 130 includes a low dielectric material, the hardness of the low dielectric material may be relatively lower than the hardness of the encapsulant M. As a result, there may be a possibility that a crack extending in the low dielectric material in the horizontal direction is generated. However, the semiconductor package 100a according to the exemplary embodiment of the disclosure includes an extension 242 disposed between the encapsulant M and each of the device layer 114, the lower insulating layer 116, the upper insulating layer 120 and the protective layer 130 and, as such, the device layer 114, the lower insulating layer 116, the upper insulating layer 120 and the protective layer 130 may be prevented from directly contacting the encapsulant M under the overhang 211 (see FIG. 4). Accordingly, crack generation of the semiconductor package 100a may be prevented or reduced and, as such, reliability of the device may be enhanced.

Figure 4:
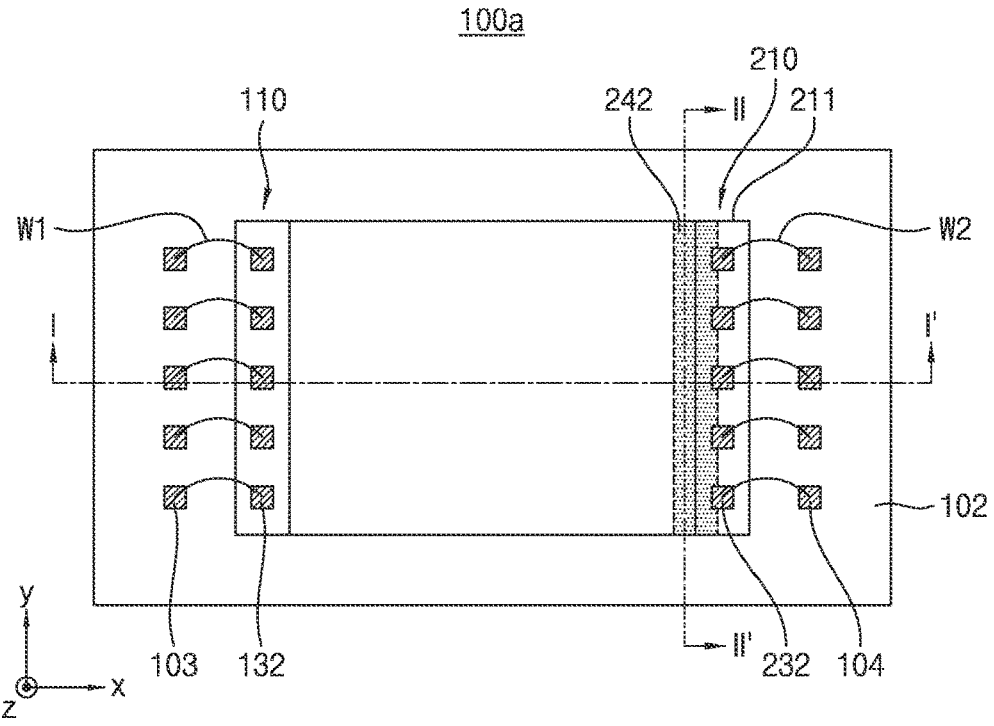
FIG. 4 is a plan view of the semiconductor package shown in FIG. 1.
Figure 5:
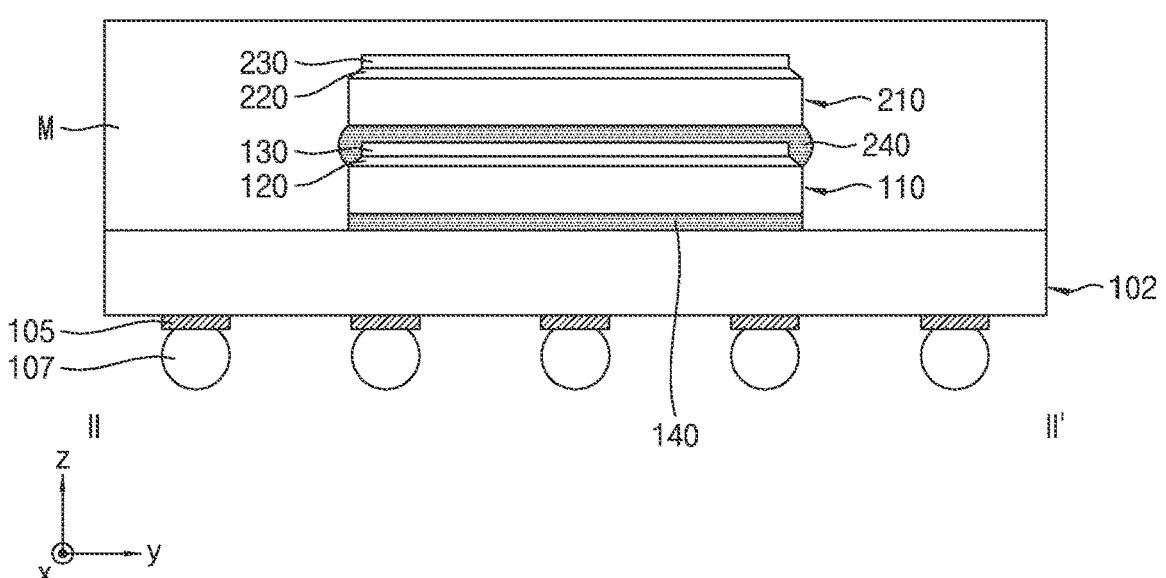
FIG. 5 is a vertical cross-sectional view of the semiconductor package shown in FIG. 4.

FIG. 4 is a plan view of the semiconductor package shown in FIG. 1. FIG. 5 is a vertical cross-sectional view of the semiconductor package shown in FIG. 4. In detail, FIG. 1 is a cross-sectional view taken along line I-I' in FIG. 4. FIG. 5 is a cross-sectional view taken along line II-II' in FIG. 4. Although the adhesive member is disposed throughout the lower surface of the second semiconductor chip, FIG. 4 shows only the extension of the adhesive member, for convenience of illustration.

Referring to FIG. 4, the first semiconductor chip 110 and the second semiconductor chip 210 may be disposed in the form of an offset stack structure in which side surfaces of the first semiconductor chip 110 and the second semiconductor chip 210 are spaced apart from each other in the x direction. The extension 242 may be disposed under the overhang 211 of the second semiconductor chip 210. For example, the extension 242 may partially overlap with the overhang 211. In plan view, the extension 242 may also be disposed along the side surface of the first semiconductor substrate 112, and may extend along an outer side surface of the first semiconductor chip 110 in a y direction. In plan view, the outer side surface of the first semiconductor chip 110 may mean the side surface of the first semiconductor substrate 112.

Referring to FIG. 5, in plan view, the adhesive member 240 may contact all of y-directional side surfaces of the first semiconductor chip 110. For example, the adhesive member 240 may cover the upper insulating layer 120 and the protective layer 130 of the first semiconductor chip 110. Here, "x-directional side surface" and "y-directional side surface" represent a surface perpendicular to the x direction and a surface perpendicular to the y direction, respectively. In cross-sectional view, the adhesive member 240 may be interposed between the encapsulant M and each of the upper insulating layer 120 and the protective layer 130 and, as such, the upper insulating layer 120 and the protective layer 130 may be prevented from contacting the encapsulant M. A y-directional side surface of the adhesive member 240 may be rounded, and may further protrude beyond at least one of y-directional side surfaces of the first semiconductor chip 110 and the second semiconductor chip 210 in the y direction.

Figure 6:
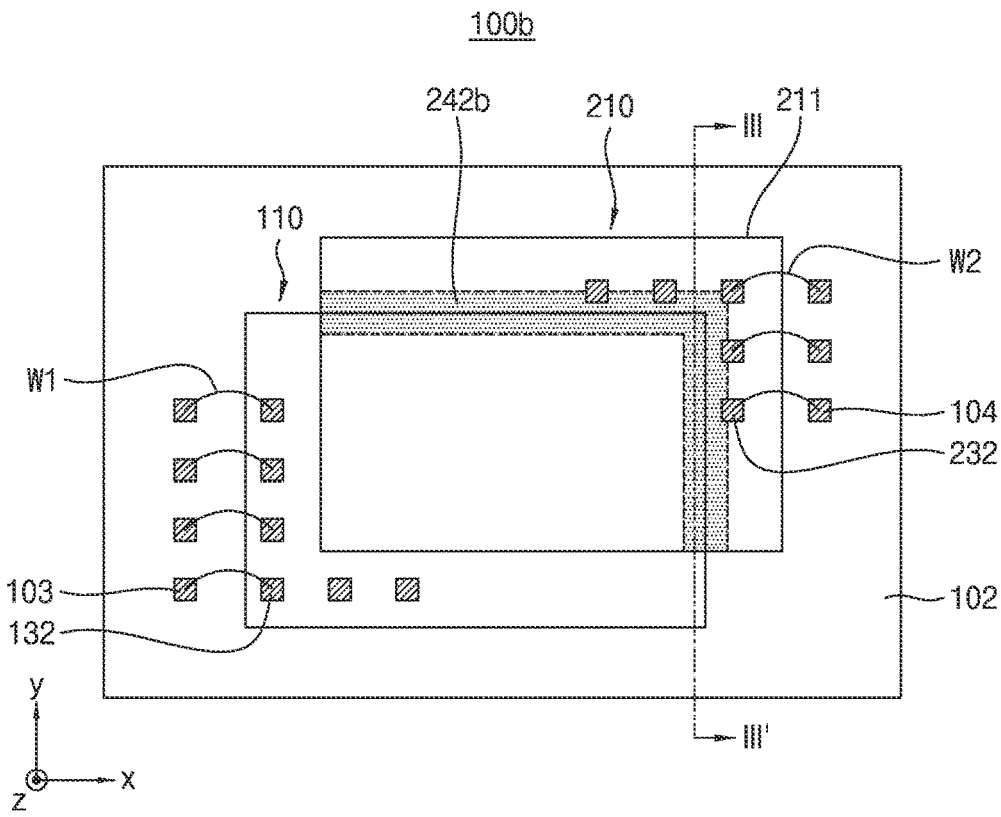
FIG. 6 is a plan view of a semiconductor package, according to an exemplary embodiment of the disclosure.
Figure 7:
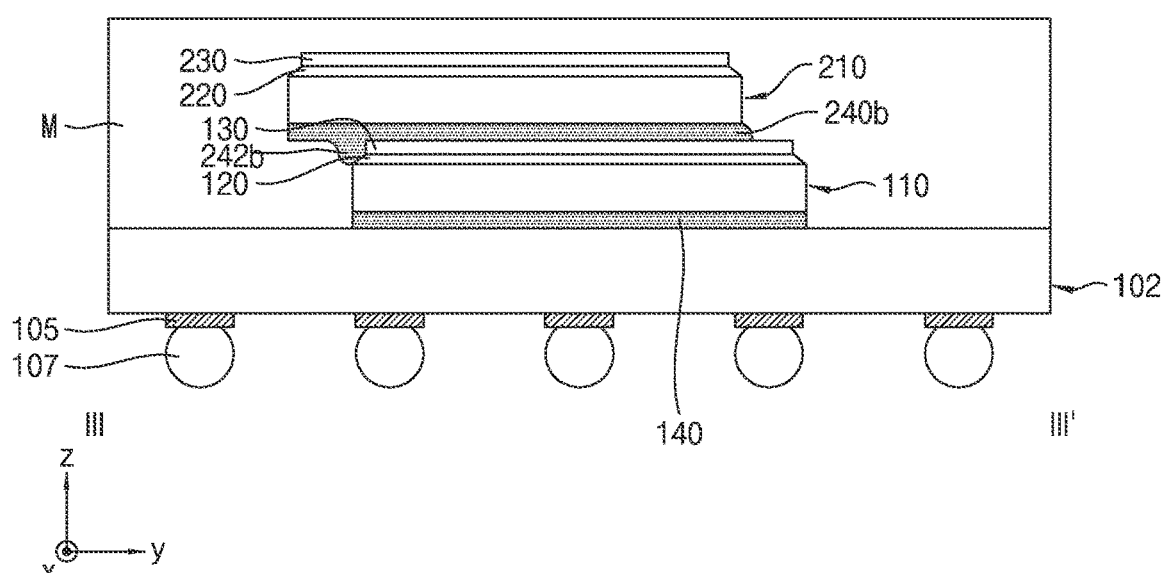
FIG. 7 is a vertical cross-sectional view of the semiconductor package shown in FIG. 6.

FIG. 6 is a plan view of a semiconductor package according to an exemplary embodiment of the disclosure. FIG. 7 is a vertical cross-sectional view of the semiconductor package shown in FIG. 6. In detail, FIG. 7 is a cross-sectional view taken along line III-III' in FIG. 6. Although an adhesive member is disposed throughout a lower surface of a second semiconductor chip, FIG. 6 shows only an extension of the adhesive member, for convenience of illustration.

Referring to FIG. 6, a first semiconductor chip 110 and a second semiconductor chip 210 of a semiconductor package 100b may be disposed in the form of an offset stack structure in which side surfaces of the first semiconductor chip 110 and the second semiconductor chip 210 are spaced apart from each other in an x direction and a y direction. For example, the first semiconductor chip 110 and the second semiconductor chip 210 may be misaligned from each other in the x direction and/or the y direction. An adhesive member 240b of the semiconductor package 100b may include an extension 242b. The extension 242b may be disposed under an overhang 211 of the second semiconductor chip 210. For example, the extension 242b may partially overlap with the overhang 211. The extension 242b may also extend along an outer side surface of the first semiconductor chip 110 in the x direction and the y direction. In plan view, the extension 242b may have a bent shape in which bar-shaped structures respectively extending in the x direction and the y direction are coupled. The extension 242b may be disposed along a side surface of the first semiconductor chip 110 (for example, a side surface of a first semiconductor substrate 112).

Referring to FIG. 7, in cross-sectional view, the adhesive member 240b may contact one of the y-directional side surfaces of the first semiconductor chip 110. One of the y-directional side surfaces of the adhesive member 240b may be rounded, and may further protrude beyond a y-directional side surface of the second semiconductor chip 210 in the y direction.

Figure 8:
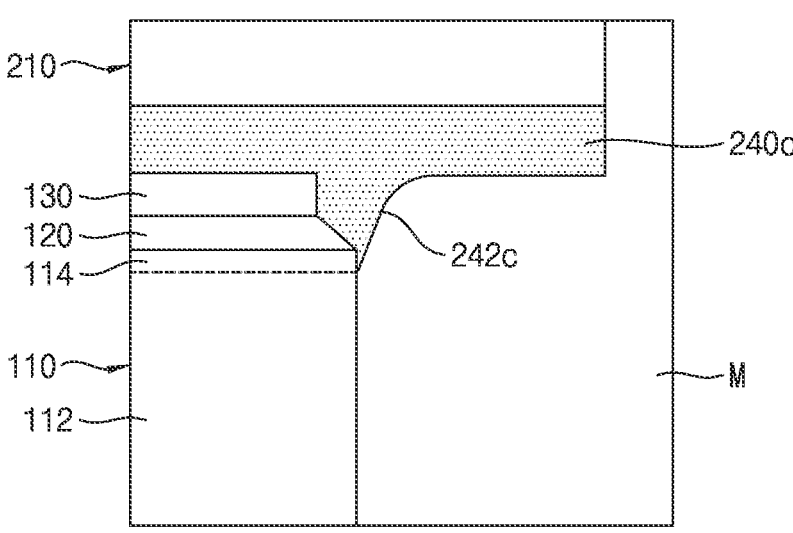
FIGS. 8 to 10 are vertical cross-sectional views of semiconductor packages, according to exemplary embodiments of the disclosure.
Figure 9:
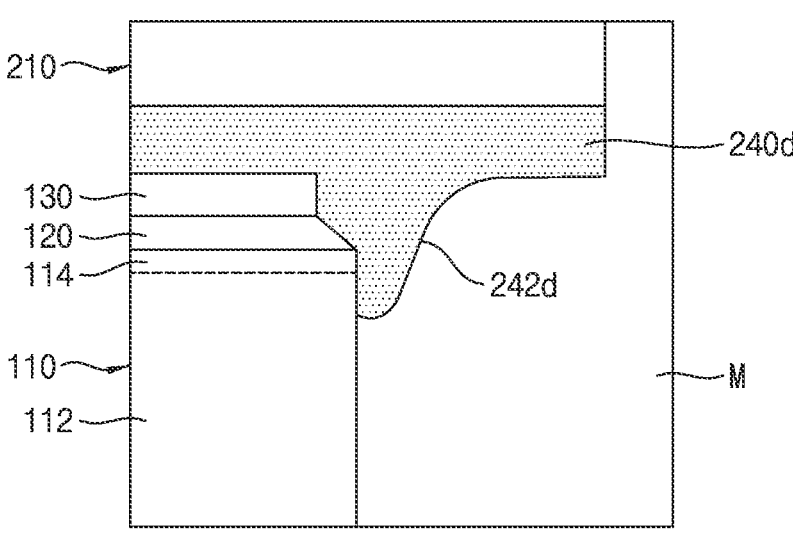
Figure 10:
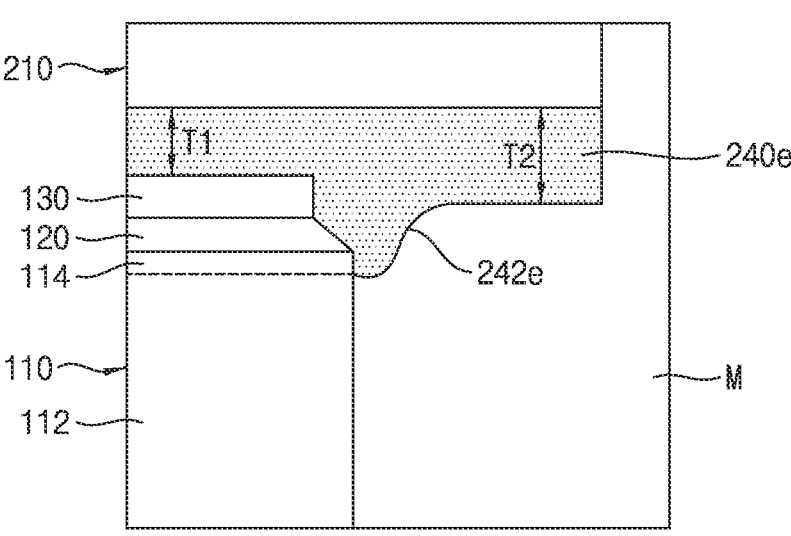

FIGS. 8 to 10 are vertical cross-sectional views of semiconductor packages according to exemplary embodiments of the disclosures. Each of FIGS. 8 to 10 may be enlarged views of a portion of FIG. 1.

Referring to FIG. 8, a semiconductor package 100c may include an adhesive member 240c disposed under a second semiconductor chip 210. The adhesive member 240c may include an extension 242c extending downwards and covering side surfaces of a device layer 114, an upper insulating layer 120, and a protective layer 130 of a first semiconductor chip 110. For example, the extension 242c may contact side surfaces of the device layer 114, the upper insulating layer 120, and the protective layer 130 of the first semiconductor chip 110. In an embodiment, in cross-sectional view, the extension 242c may be concave at a side surface thereof.

Referring to FIG. 9, a semiconductor package 100d may include an adhesive member 240d disposed under a second semiconductor chip 210. The adhesive member 240d may include an extension 242d extending downwards and covering side surfaces of a device layer 114, an upper insulating layer 120, and a protective layer 130 of a first semiconductor chip 110. For example, the extension 242d may contact side surfaces of the device layer 114, the upper insulating layer 120, and the protective layer 130 of the first semiconductor chip 110. In an embodiment, the extension 242d may further extend to a lower level than the device layer 114 such that the extension 242d may contact a side surface of a first semiconductor substrate 112.

Referring to FIG. 10, a semiconductor package 100e may include an adhesive member 240e disposed under a second semiconductor chip 210. The adhesive member 240e may include an extension 242e extending downwards and covering side surfaces of a device layer 114, an upper insulating layer 120, and a protective layer 130 of a first semiconductor chip 110. For example, the extension 242e may contact side surfaces of the device layer 114, the upper insulating layer 120, and the protective layer 130 of the first semiconductor chip 110. A portion of the adhesive member 240e disposed between the first semiconductor chip 110 and the second semiconductor chip 210 may have a first thickness T1. An x-directional end of the adhesive member 240e may have a second thickness T2. In an embodiment, the second thickness T2 may be greater than the first thickness T1. In addition, the second thickness T2 may be smaller than the maximum thickness of the extension 242e.

Figure 11:
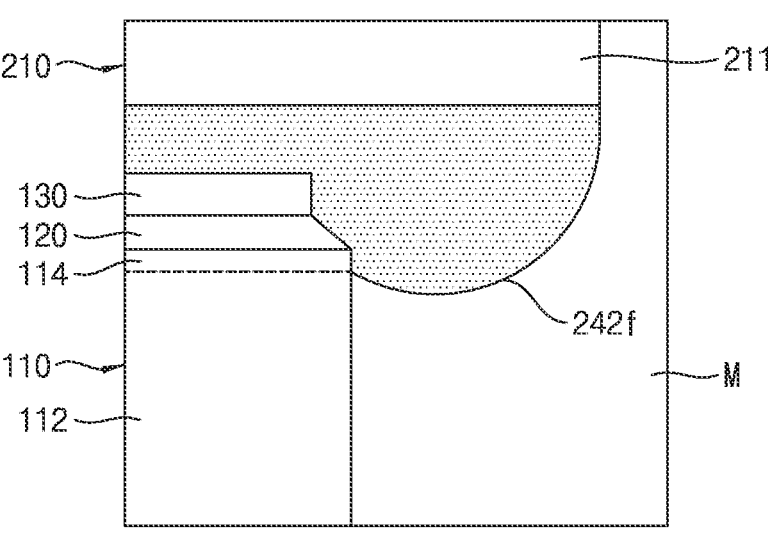
FIG. 11 is a vertical cross-sectional view of a semiconductor package, according to an exemplary embodiment of the disclosure.
Figure 12:
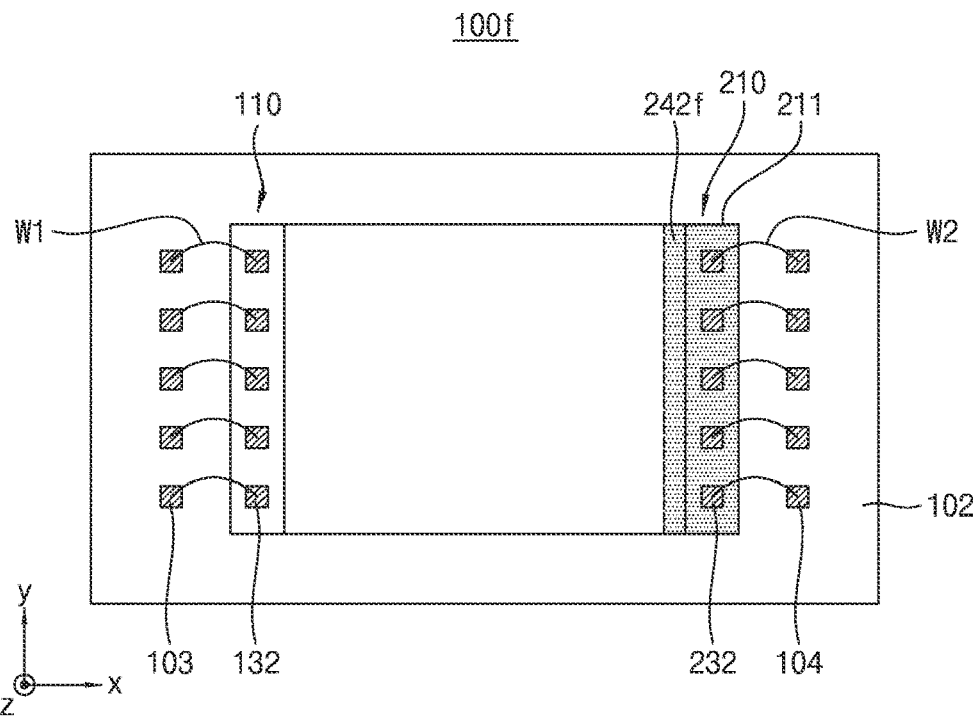
FIG. 12 is a plan view of the semiconductor package shown in FIG. 11.

FIG. 11 is a vertical cross-sectional view of a semiconductor package according to an exemplary embodiment of the disclosure. FIG. 12 is a plan view of the semiconductor package shown in FIG. 11.

Referring to FIG. 11, a semiconductor package 100f may include an adhesive member 240f disposed under a second semiconductor chip 210. The adhesive member 240f may include an extension 242f extending downwards and covering side surfaces of a device layer 114, an upper insulating layer 120, and a protective layer 130 of a first semiconductor chip 110. For example, the extension 242f may contact side surfaces of the device layer 114, the upper insulating layer 120, and the protective layer 130 of the first semiconductor chip 110. In an embodiment, the extension 242f may be disposed to extend from a side surface of the protective layer 130 to a side surface of an overhang 211 of the second semiconductor chip 210.

Referring to FIG. 12, the extension 242f may be disposed under the overhang 211 of the second semiconductor chip 210. For example, the extension 242f may completely overlap with the overhang 211. In plan view, the extension 242f may be disposed along a side surface of the first semiconductor chip 110 (for example, a side surface of a first semiconductor substrate 112), and may extend along an outer side surface of the first semiconductor chip 110 in a y direction.

Figure 13:
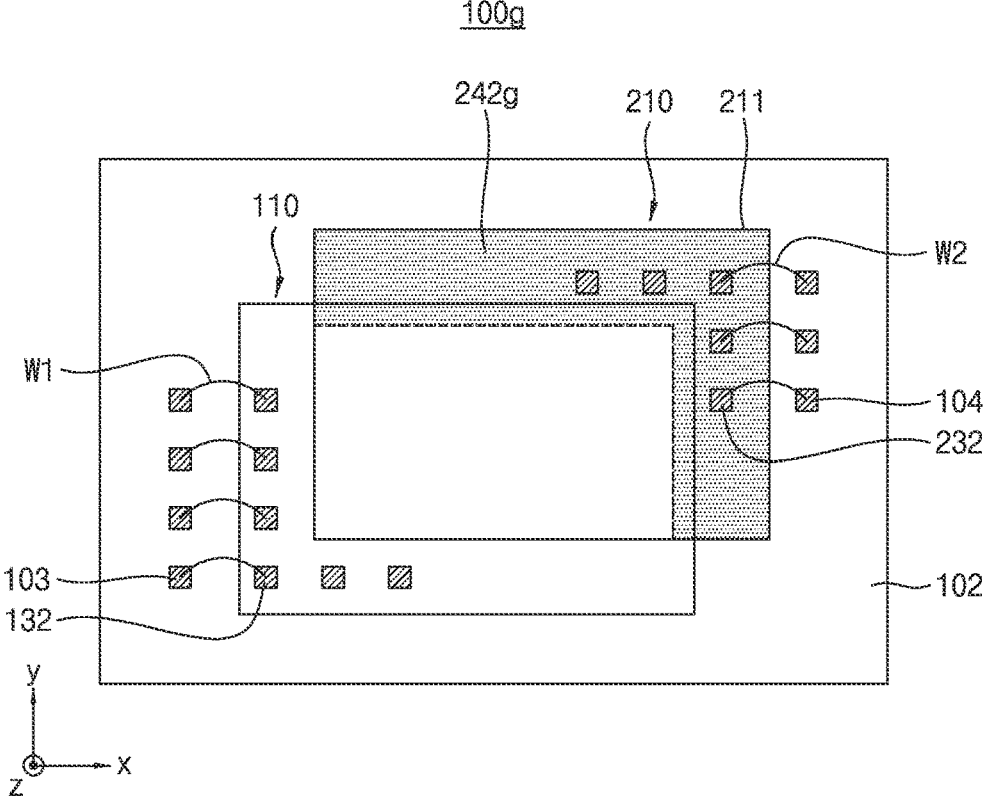
FIG. 13 is a plan view of a semiconductor package, according to an exemplary embodiment of the disclosure.

FIG. 13 is a plan view of a semiconductor package according to an exemplary embodiment of the disclosure.

Referring to FIG. 13, an adhesive member 240 of a semiconductor package 100g may include an extension 242g. In an embodiment, a first semiconductor chip 110 and a second semiconductor chip 210 may be disposed in the form of an offset stack structure in which side surfaces of the first semiconductor chip 110 and the second semiconductor chip 210 are spaced apart from each other in an x direction and a y direction. In addition, the extension 242g may completely overlap with an overhang 211, and may be disposed along a side surface of the first semiconductor chip 110 (for example, a side surface of a first semiconductor substrate 112). The extension 242g may extend in the x direction and the y direction.

Figure 14:
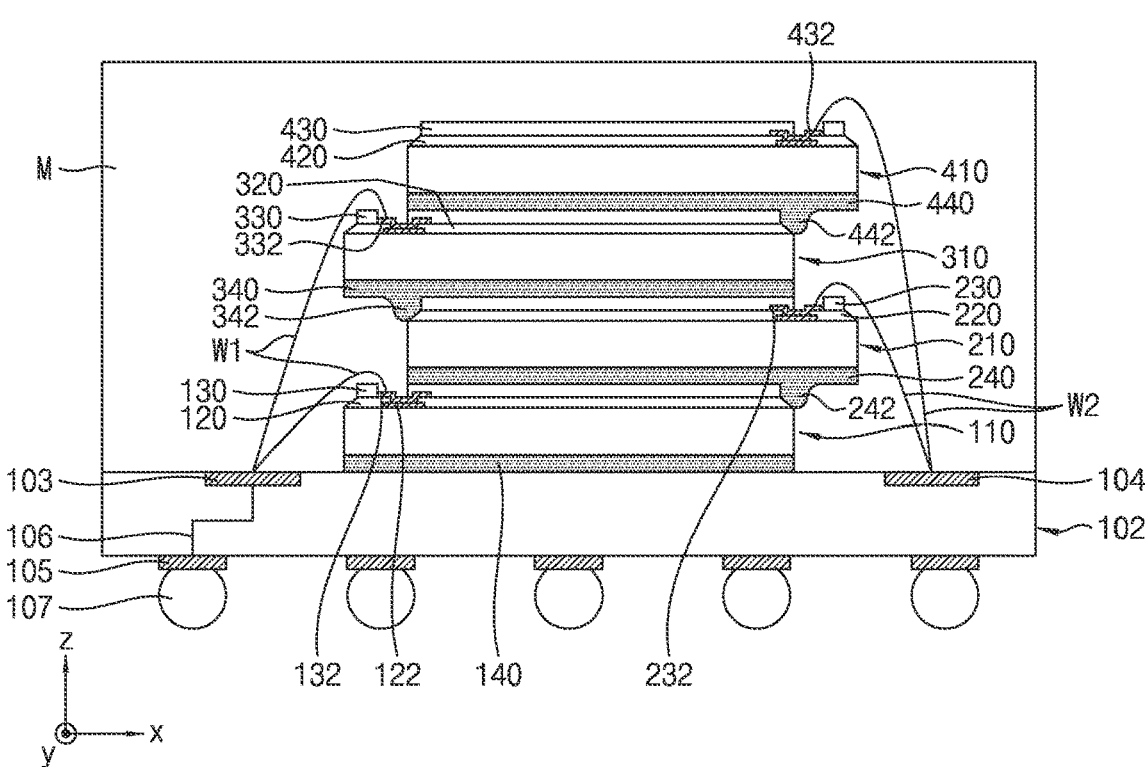
FIG. 14 is a vertical cross-sectional view of a semiconductor package, according to an exemplary embodiment of the disclosure.
Figure 15:
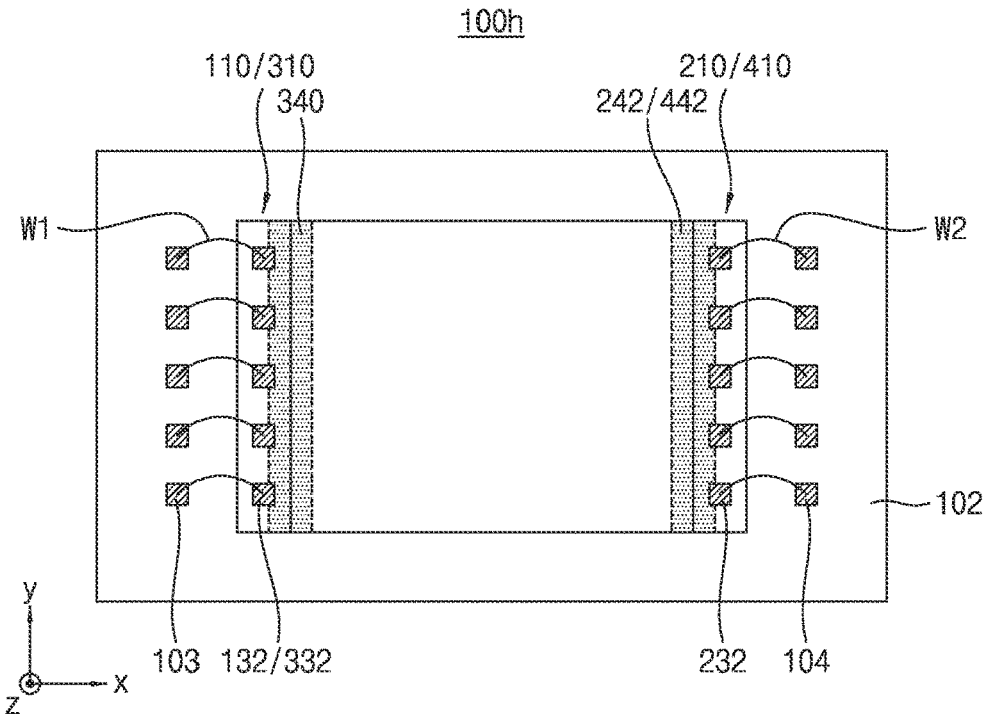
FIG. 15 is a plan view of the semiconductor package shown in FIG. 14.

FIG. 14 is a vertical cross-sectional view of a semiconductor package according to an exemplary embodiment of the disclosure. FIG. 15 is a plan view of the semiconductor package shown in FIG. 14.

Referring to FIG. 14, a semiconductor package 100h may include a first semiconductor chip 110, a second semiconductor chip 210, a third semiconductor chip 310, and a fourth semiconductor chip 410 which are sequentially stacked on a package substrate 102. In an embodiment, the first to fourth semiconductor chips 110, 210, 310, and 410 may be mounted on the package substrate 102 via wire bonding. For example, each of the first and third semiconductor chips 110 and 310 may be electrically connected to an upper pad 103 via first bonding wires W1 corresponding thereto. Each of the second and fourth semiconductor chips 210 and 410 may be electrically connected to an upper pad 104 via second bonding wires W2 corresponding thereto. In an embodiment, the first semiconductor chip 110 and the second semiconductor chip 210 may be misaligned from each other in a vertical direction (a z direction), and may be disposed in the form of an offset stack structure. For example, side surfaces of adjacent ones of the semiconductor chips 110, 210, 310, and 410 may be spaced apart from each other by a predetermined distance in an x direction, and the semiconductor chips 110, 210, 310, and 410 may be stacked in the form of a zig-zag structure. Each of the first to third semiconductor chips 110, 210, and 310 may be exposed at a portion of an upper surface thereof without being covered by the semiconductor chip disposed thereover.

The semiconductor package 100h may have a structure identical or similar to that of the semiconductor package 100a shown in FIG. 1. The first to fourth semiconductor chips 110, 210, 310, and 410 may include respective upper insulating layers 120, 220, 320, and 420, respective protective layers 130, 230, 330, and 430, and respective connection pads 132, 232, 332, and 432. In addition, adhesive members 140, 240, 340, and 440 may be disposed on lower surfaces of the first to fourth semiconductor chips 110, 210, 310, and 410, respectively. The adhesive members 240, 340, and 440 may include extensions 242, 342, and 442, respectively. For example, the extension 242 may contact the upper insulating layer 120 and the protective layer 130 of the first semiconductor chip 110, the extension 342 may contact the upper insulating layer 220 and the protective layer 230 of the second semiconductor chip 210, and the extension 442 may contact the upper insulating layer 320 and the protective layer 330 of the third semiconductor chip 310. In cross-sectional view, overhangs and the extensions 242, 342, and 442 of the second to fourth semiconductor chips 210, 310, and 410 may be disposed in the form of a zig-zag structure. For example, the extension 242 may be aligned with the extension 442 in a vertical direction, and the extension 342 may be spaced apart from the extensions 242 and 442 in the x direction.

Referring to FIG. 15, in plan view, the first semiconductor chip 110 may completely overlap with the third semiconductor chip 310, and the second semiconductor chip 210 may completely overlap with the fourth semiconductor chip 410. The extension 242 may overlap with the extension 442. The extensions 242 and 442 may extend along outer side surfaces of the first semiconductor chip 110 and the third semiconductor chip 310 in a y direction, respectively. The extension 342 may be spaced apart from the extensions 242 and 442 in the x direction, and may extend along an outer side surface of the second semiconductor chip 210 in the y direction.

Figure 16:
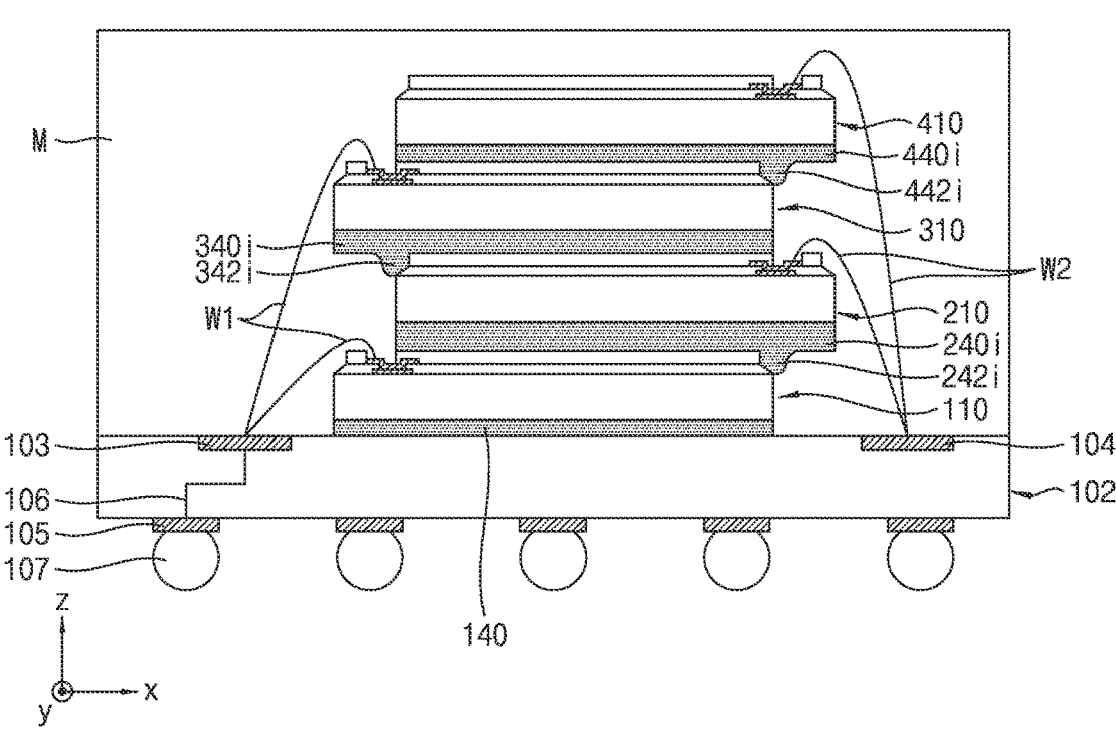
FIG. 16 is a vertical cross-sectional view of a semiconductor package, according to an exemplary embodiment of the disclosure.

FIG. 16 is a vertical cross-sectional view of a semiconductor package according to an exemplary embodiment of the disclosure.

Referring to FIG. 16, a semiconductor package 100i may include adhesive members 240i, 340i, and 440i respectively disposed on lower surfaces of second to fourth semiconductor chips 210, 310, and 410, and the adhesive members 240i, 340i, and 440i may include extensions 242i, 342i, and 442i, respectively. In an embodiment, at least two of the adhesive members 240i, 340i and 440i may have different thicknesses. For example, the adhesive member 240i may be thicker than the adhesive member 340i, and the adhesive member 340i may be thicker than the adhesive member 440i. In addition, the extension 242i may be thicker than the extension 342i, and the extension 342i may be thicker than the extension 442i. In an embodiment, the thickness of the adhesive member 440i may be equal to the thickness of an adhesive member 140, and the thickness of the adhesive member 240i may be greater than the thickness of the adhesive member 140.

Figure 17:
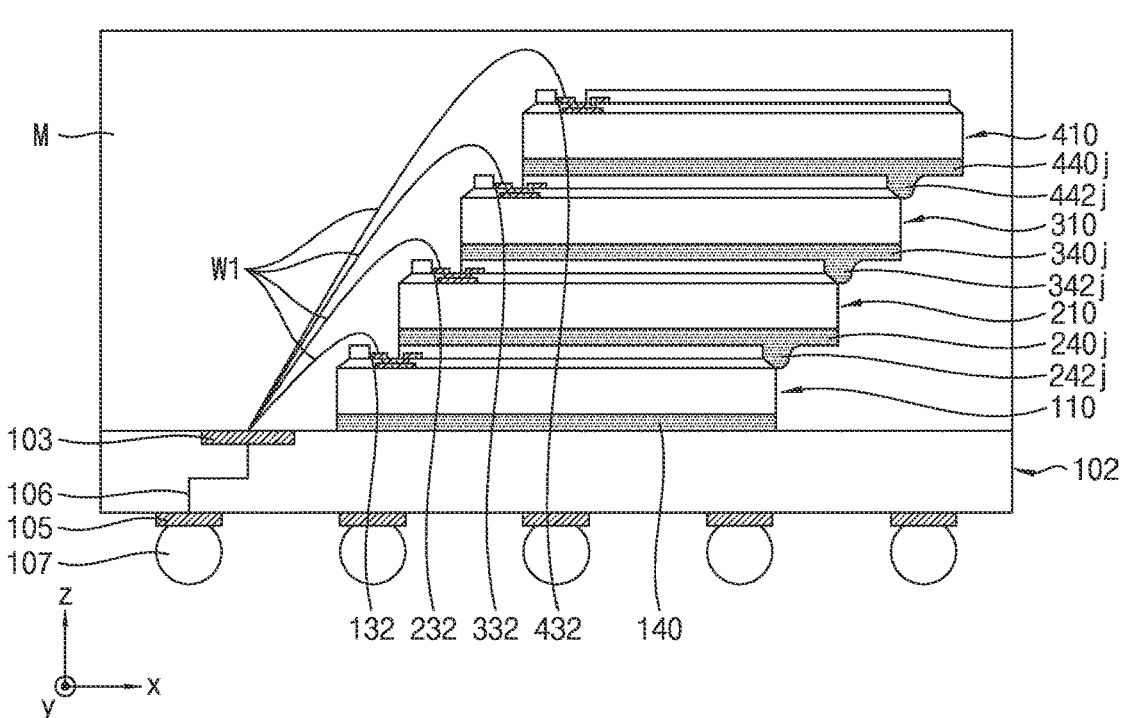
FIG. 17 is a vertical cross-sectional view of a semiconductor package, according to an exemplary embodiment of the disclosure.
Figure 18:
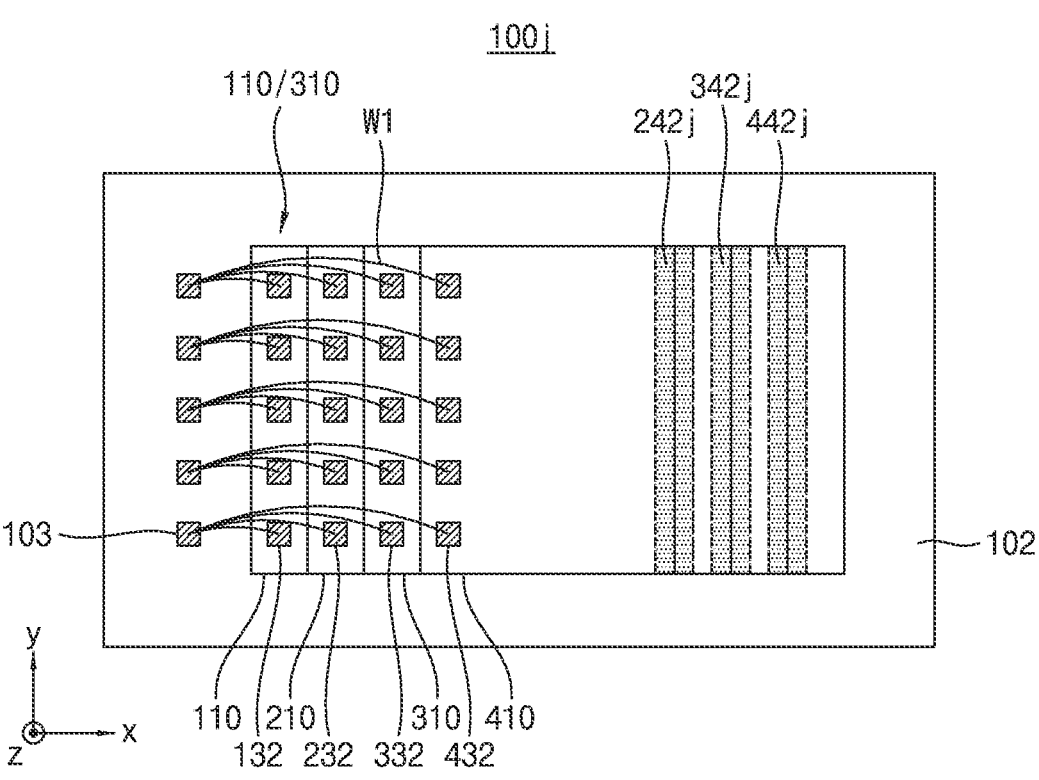
FIG. 18 is a plan view of the semiconductor package shown in FIG. 17.

FIG. 17 is a vertical cross-sectional view of a semiconductor package according to an exemplary embodiment of the disclosure. FIG. 18 is a plan view of the semiconductor package shown in FIG. 17.

Referring to FIG. 17, a semiconductor package 110j may include a first semiconductor chip 110, a second semiconductor chip 210, a third semiconductor chip 310, and a fourth semiconductor chip 410 which are sequentially stacked on a package substrate 102. In an embodiment, the first to fourth semiconductor chips 110, 210, 310, and 410 may be mounted on the package substrate 102 via wire bonding. For example, each of connection pads 132, 232, 332, and 432 may be electrically connected to an upper pad 103 via first bonding wires W1 corresponding thereto. In an embodiment, the first semiconductor chip 110 and the second semiconductor chip 210 may be misaligned from each other in a vertical direction (a z direction), and may be disposed in the form of an offset stack structure. For example, side surfaces of adjacent ones of the semiconductor chips 110, 210, 310, and 410 may be spaced apart from each other by a predetermined distance in an x direction, and the semiconductor chips 110, 210, 310, and 410 may be stacked in the form of a stack structure or a staircase structure.

The semiconductor package 100j may include adhesive members 140, 240j, 340j, and 440j respectively disposed on lower surfaces of the first to fourth semiconductor chips 110, 210, 310, and 410. The adhesive members 240j, 340j, and 440j may include extensions 242j, 342j, and 442j, respectively. For example, the extension 242j may contact a side surface of the first semiconductor chip 110, the extension 342j may contact a side surface of the second semiconductor chip 210, and the extension 442j may contact a side surface of the third semiconductor chip 310. In cross-sectional view, overhangs of the second to fourth semiconductor chips 210, 310, and 410 may be sequentially arranged in the x direction.

Referring to FIG. 18, in a plan view, the first to fourth semiconductor chips 110, 210, 310, and 410 may be sequentially arranged in the x direction. The extensions 242j, 342j, and 442j may be sequentially arranged in the x direction. Although the extensions 242j, 342j, and 442j are shown in FIG. 18 as not overlapping one another, the exemplary embodiments of the disclosure are not limited thereto. The extensions 242j, 342j, and 442j may extend along outer side surfaces of the first to third semiconductor chips 110, 210, and 310 in the y direction, respectively.

Figure 19:
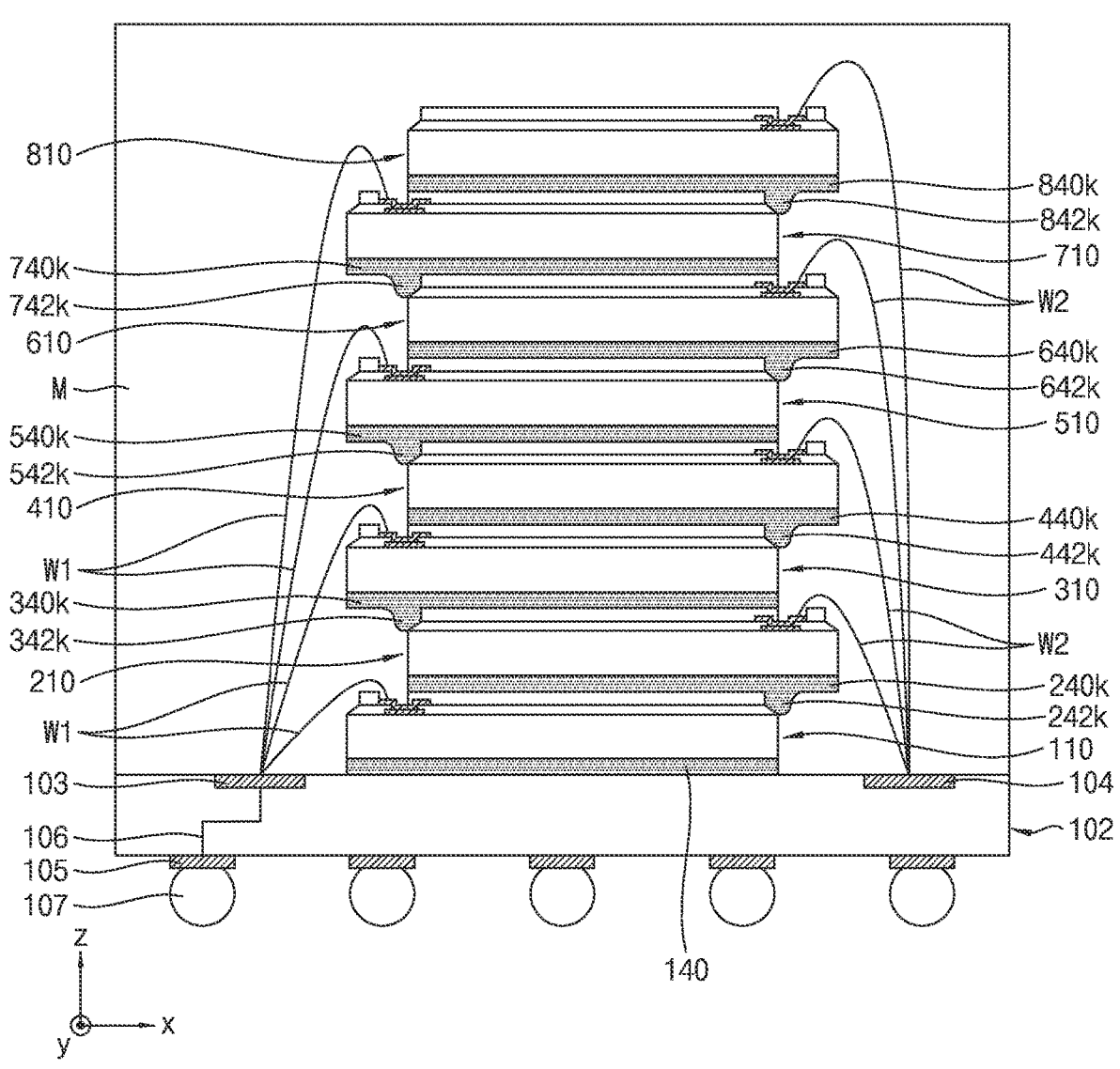
FIGS. 19 and 20 are vertical cross-sectional views of semiconductor packages, according to exemplary embodiments of the disclosure, respectively.
Figure 20:
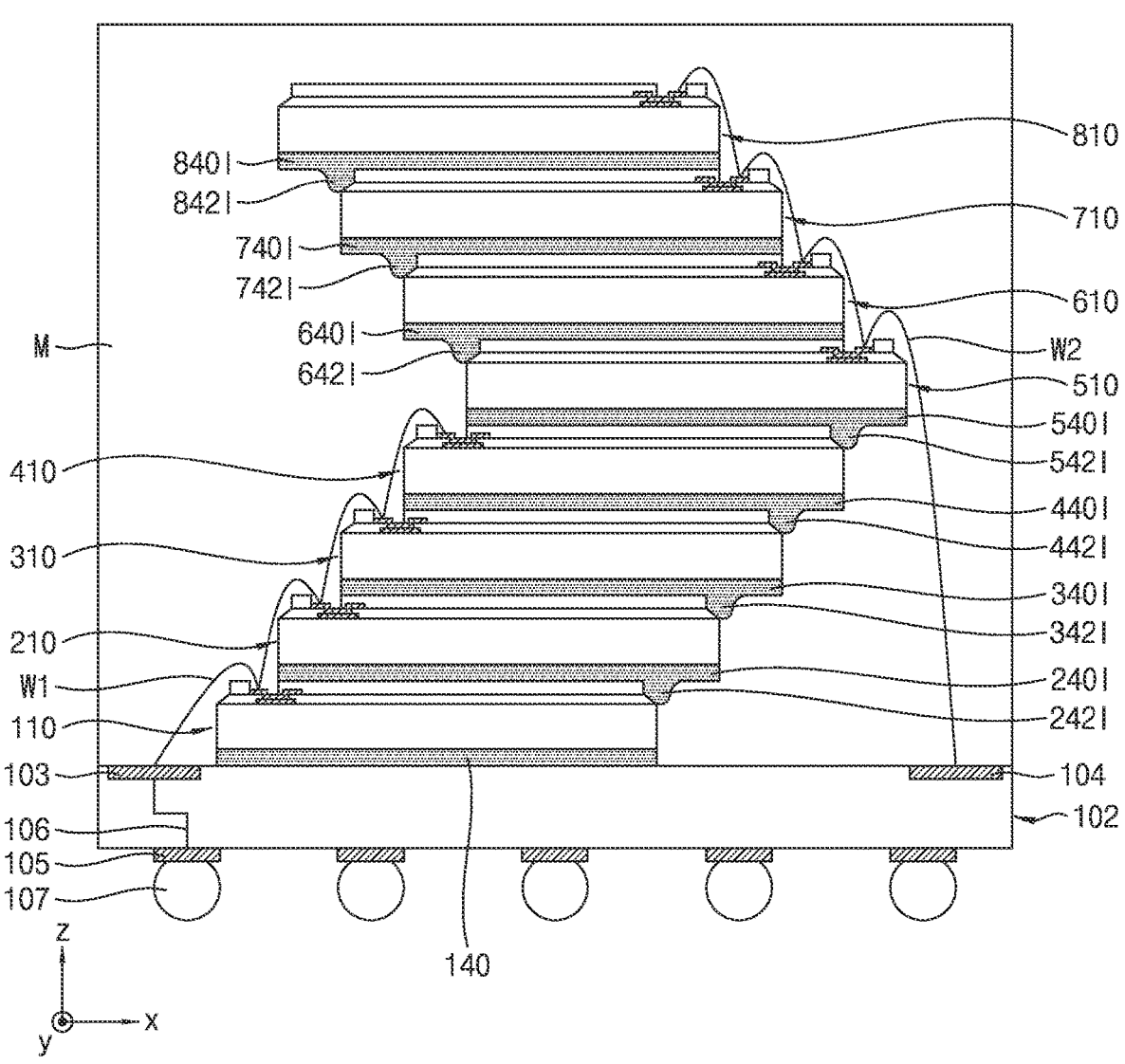

FIGS. 19 and 20 are vertical cross-sectional views of semiconductor packages according to exemplary embodiments of the disclosure, respectively.

Referring to FIG. 19, a semiconductor package 100k may include first to eighth semiconductor chips 110, 210, 310, 410, 510, 610, 710, and 810 sequentially stacked on a package substrate 102 via wire bonding. For example, each of the first, third, fifth, and seventh semiconductor chips 110, 310, 510, and 710 may be electrically connected to an upper pad 103 via first bonding wires W1 corresponding thereto. Each of the second, fourth, sixth, and eighth semiconductor chips 210, 410, 610, and 810 may be electrically connected to an upper pad 104 via a second bonding wire W2 corresponding thereto. In an embodiment, the first to eighth semiconductor chips 110, 210, 310, 410, 510, 610, 710, and 810 may be disposed in the form of an offset stack structure. For example, side surfaces of adjacent ones of the first to eighth semiconductor chips 110, 210, 310, 410, 510, 610, 710, and 810 may be spaced apart from each other by a predetermined distance in an x direction, and the first to eighth semiconductor chips 110, 210, 310, 410, 510, 610, 710, and 810 may be stacked in the form of a zigzag structure.

The semiconductor package 100k may include adhesive members 140, 240k, 340k, 440k, 540k, 640k, 740k, and 840k respectively disposed on lower surfaces of the first to eighth semiconductor chips 110, 210, 310, 410, 510, 610, 710, and 810. The adhesive members 240k, 340k, 440k, 540k, 640k, 740k, and 840k may include extensions 242k, 342k, 442k, 542k, 642k, 742k, and 842k, respectively. For example, each of the extensions 242k, 342k, 442k, 542k, 642k, 742k, and 842$k$ may contact a side surface of the semiconductor chip disposed thereunder. In cross-sectional view, overhangs of the second to eighth semiconductor chips 210, 310, 410, 510, 610, 710, and 810 and the extensions 242$k$, 342$k$, 442$k$, 542$k$, 642$k$, 742$k$, and 842$k$ may be disposed in the form of a zigzag structure. For example, the extensions 242$k$, 442$k$, 642$k$, and 842$k$ may be vertically aligned, and the extensions 342$k$, 542$k$, and 742$k$ may be vertically aligned.

Referring to FIG. 20, a semiconductor package 100$l$ may include first to eighth semiconductor chips sequentially stacked on a package substrate 102 via wire bonding.

For example, first to fourth semiconductor chips 110, 210, 310, and 410 may be electrically connected to an upper pad 103 via first bonding wires W1. Fifth to eighth semiconductor chips 510, 610, 710, and 810 may be electrically connected to an upper pad 104 via second bonding wires W2. In an embodiment, the first to eighth semiconductor chips 110, 210, 310, 410, 510, 610, 710, and 810 may not be aligned in a vertical direction (a z direction), and may be disposed in the form of an offset stack structure. For example, the first to fourth semiconductor chips 110, 210, 310, and 410 may be disposed in the form of a cascade stack structure or a staircase structure. The fifth to eighth semiconductor chips 510, 610, 710, and 810 may be disposed in the form of a cascade stack structure or a staircase structure in which the fifth to eighth semiconductor chips 510, 610, 710, and 810 are stacked in a direction reverse to the stack direction of the first to fourth semiconductor chips 110, 210, 310, and 410.

The semiconductor package 100$l$ may include adhesive members 140, 240$l$, 340$l$, 440$l$, 540$l$, 640$l$, 740$l$, and 840$l$ respectively disposed on lower surfaces of the first to eighth semiconductor chips 110, 210, 310, 410, 510, 610, 710, and 810. The adhesive members 240$l$, 340$l$, 440$l$, 540$l$, 640$l$, 740$l$, and 840$l$ may include extensions 242$l$, 342$l$, 442$l$, 542$l$, 642$l$, 742$l$, and 842$l$, respectively. For example, each of the extensions 242$l$, 342$l$, 442$l$, 542$l$, 642$l$, 742$l$, and 842$l$ may contact a side surface of the semiconductor chip disposed thereunder. In cross-sectional view, the extensions 242$l$, 342$l$, 442$l$, and 542$l$ may be sequentially disposed in an x direction. The extensions 642$l$, 742$l$, and 842$l$ may be sequentially disposed in a direction reverse to the stack direction of the extensions 242$l$, 342$l$, 442$l$, and 542$l$.

In accordance with the exemplary embodiments of the disclosure, crack generation of a semiconductor package may be prevented or reduced and, as such, reliability of the device may be enhanced.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor package comprising:
a package substrate including upper pads;
a first semiconductor chip and a second semiconductor chip sequentially stacked on the package substrate, the first semiconductor chip and the second semiconductor chip being disposed in a form of an offset stack structure, and the second semiconductor chip including an overhang further protruding beyond a side surface of the first semiconductor chip in a first horizontal direction;

bonding wires connecting the first semiconductor chip and the second semiconductor chip to the upper pads;
an adhesive member disposed on a lower surface of the second semiconductor chip and fixing the second semiconductor chip to the first semiconductor chip, the adhesive member including an extension extending to a lower level than an upper surface of the first semiconductor chip; and
an encapsulant covering the package substrate, the first semiconductor chip, and the second semiconductor chip,
wherein the extension contacts the side surface of the first semiconductor chip, and overlaps with at least a portion of the overhang in a vertical direction.

2. The semiconductor package according to claim 1, wherein:
the first semiconductor chip includes an upper insulating layer disposed on an upper portion of the first semiconductor chip, and a protective layer on the upper insulating layer; and
the extension contacts the upper insulating layer and the protective layer of the first semiconductor chip.

3. The semiconductor package according to claim 2, wherein the extension is interposed between the encapsulant and the upper insulating layer and between the encapsulant and the protective layer.

4. The semiconductor package according to claim 2, wherein:
the first semiconductor chip further includes a first semiconductor substrate, a device layer on the first semiconductor substrate, and a lower insulating layer between the device layer and the upper insulating layer; and
the extension further contacts the device layer and the lower insulating layer.

5. The semiconductor package according to claim 4, wherein the extension further contacts the first semiconductor substrate.

6. The semiconductor package according to claim 4, wherein a horizontal length of the protective layer is smaller than a horizontal length of the first semiconductor substrate.

7. The semiconductor package according to claim 4, wherein at least one of the device layer, the lower insulating layer, the upper insulating layer, and the protective layer includes a low dielectric material.

8. The semiconductor package according to claim 1, wherein, in plan view, the extension extends along an outer side surface in the first horizontal direction of the first semiconductor chip and in a second horizontal direction intersecting the first horizontal direction.

9. The semiconductor package according to claim 8, wherein at least one of side surfaces in the second horizontal direction of the extension is rounded, and further protrudes beyond a side surface in the second horizontal direction of the second semiconductor chip.

10. The semiconductor package according to claim 1, wherein:
the first semiconductor chip and the second semiconductor chip are offset from each other in a second horizontal direction intersecting the first horizontal direction; and
in plan view, the extension extends along an outer side surface of the first semiconductor chip in the first horizontal direction and the second horizontal direction.

11. The semiconductor package according to claim 10, wherein one of side surfaces in the second horizontal direction of the extension is rounded, and further protrudes beyond a side surface in the second horizontal direction of the second semiconductor chip.

12. The semiconductor package according to claim 1, wherein, in cross-sectional view, a side surface of the extension is concave.

13. The semiconductor package according to claim 1, wherein:

a portion of the adhesive member disposed between the upper surface of the first semiconductor chip and the lower surface of the second semiconductor chip has a first thickness; and an end in the first horizontal direction of the adhesive member has a second thickness greater than the first thickness.

14. The semiconductor package according to claim 13, wherein the second thickness is smaller than a maximum thickness of the extension.

15. The semiconductor package according to claim 1, wherein the extension completely overlaps with the overhang in the vertical direction.

16. A semiconductor package comprising:

a package substrate including upper pads;

first to fourth semiconductor chips sequentially stacked on the package substrate, the first to fourth semiconductor chips being disposed in a form of an offset stack structure, and each of the second to fourth semiconductor chips including an overhang further protruding in a first horizontal direction beyond a side surface of a semiconductor chip disposed immediately thereunder;

bonding wires connecting the first to fourth semiconductor chips to the upper pads;

adhesive members respectively disposed on lower surfaces of the second to fourth semiconductor chips and respectively fixing the second to fourth semiconductor chips to the first to third semiconductor chips, the adhesive members including extensions, respectively; and an encapsulant covering the package substrate and the first to fourth semiconductor chips, wherein a lowermost one of the extensions contacts the side surface of the first semiconductor chip, and overlaps with at least a portion of the overhang of the second semiconductor chip in a vertical direction.

17. The semiconductor package according to claim 16, wherein the extensions are disposed in a form of a zigzag structure.

18. The semiconductor package according to claim 16, wherein:

the adhesive members include a first adhesive member disposed on a lower surface of the second semiconductor chip, a second adhesive member disposed on a lower surface of the third semiconductor chip, and a third adhesive member disposed on a lower surface of the fourth semiconductor chip;

a thickness of the first adhesive member is greater than a thickness of the second adhesive member; and the thickness of the second adhesive member is greater than a thickness of the third adhesive member.

19. The semiconductor package according to claim 18, wherein:

the extensions include a first extension included in the first adhesive member and having a first thickness, a second extension included in the second adhesive member and having a second thickness, and a third extension included in the third adhesive member and having a third thickness; and the first thickness is greater than the second thickness, and the second thickness is greater than the third thickness.

20. The semiconductor package according to claim 16, wherein:

the adhesive members include a first adhesive member disposed on a lower surface of the second semiconductor chip, a second adhesive member disposed on a lower surface of the third semiconductor chip, and a third adhesive member disposed on a lower surface of the fourth semiconductor chip;

the extensions include a first extension included in the first adhesive member, a second extension included in the second adhesive member, and a third extension included in the third adhesive member;

the first to fourth semiconductor chips are stacked in a form of a cascade structure; and the first to third extensions are sequentially disposed in the first horizontal direction.

* * * * *